(12) United States Patent
Katsir et al.

(10) Patent No.: US 6,865,071 B2
(45) Date of Patent: Mar. 8, 2005

(54) ELECTROLYTIC CAPACITORS AND METHOD FOR MAKING THEM

(75) Inventors: Dina Katsir, Beer Sheva (IL); Zvi Finkelstein, Asseret (IL)

(73) Assignee: Acktar Ltd., Kiryat Gat (IL)

( * ) Notice: Subject to any disclaimer, the term of this patent is extended or adjusted under 35 U.S.C. 154(b) by 0 days.

(21) Appl. No.: 10/646,229

(22) Filed: Aug. 22, 2003

(65) Prior Publication Data

US 2004/0114310 A1 Jun. 17, 2004

Related U.S. Application Data

(63) Continuation-in-part of application No. PCT/IL02/00140, filed on Feb. 21, 2002, and a continuation-in-part of application No. 09/033,664, filed on Mar. 3, 1998, now Pat. No. 6,287,673.

(30) Foreign Application Priority Data

Feb. 22, 2001 (IL) ................................................ 141592

(51) Int. Cl.⁷ ................................................ H01G 9/00
(52) U.S. Cl. ........................ 361/523; 361/524; 29/25.03
(58) Field of Search ................................ 361/523, 524, 361/525, 527, 529; 29/25.03

(56) References Cited

U.S. PATENT DOCUMENTS

| | | | |
|---|---|---|---|
| 3,556,966 A | 1/1971 | Waxman et al. | 204/164 |
| 4,090,231 A | 5/1978 | Millard et al. | 361/433 |
| 4,309,810 A | 1/1982 | Drake | 29/570 |
| 4,453,199 A | 6/1984 | Ritchie et al. | 361/306 |
| 4,494,299 A * | 1/1985 | Franklin et al. | 29/25.03 |
| 4,537,665 A | 8/1985 | Nguyen et al. | 204/29 |
| 4,582,574 A | 4/1986 | Nguyen et al. | 204/27 |
| 4,763,229 A | 8/1988 | Ohtuka et al. | 361/433 |
| 4,970,626 A | 11/1990 | Kakinoki et al. | 361/512 |
| 5,357,399 A | 10/1994 | Salisbury | 361/529 |
| 5,431,971 A | 7/1995 | Allegret et al. | 428/148 |
| 5,482,743 A | 1/1996 | Allegret et al. | 427/566 |

(List continued on next page.)

FOREIGN PATENT DOCUMENTS

| | | | |
|---|---|---|---|
| DE | 4127743 | 3/1993 | C23C/14/16 |
| JP | 62094912 | 5/1987 | H01G/9/02 |

(List continued on next page.)

OTHER PUBLICATIONS

Donald M. Trotter, Jr., "Capacitors," *Scientific American*, Jul. 1988, pp. 58–63.

(List continued on next page.)

Primary Examiner—Anthony Dinkins
(74) Attorney, Agent, or Firm—Mayer Fortkort & Williams, PC; Karin L. Williams, Esq.

(57) ABSTRACT

A method for making an integrated electrolytic capacitor wherein a substrate (40) is coated with at least one sequence of each of the following layers: a vacuum deposited film (42) having a high specific surface area, which is selected from the group consisting of valve metals and mixtures of valve metals with valve metal oxides; superimposed on the film having a high specific surface area, at least one dielectric film (46) comprising a substance selected from the group consisting of valve metal oxides, their complex oxides with at least one rare earth metal and their complex oxides with at least one alkaline earth metal; and a solid electrolyte film (48) superimposed on the at least one film.

22 Claims, 6 Drawing Sheets

U.S. PATENT DOCUMENTS

| | | | |
|---|---|---|---|
| 5,571,158 A | 11/1996 | Bolz et al. | 607/121 |
| 5,589,416 A | 12/1996 | Chittipeddi | 437/60 |
| 5,643,432 A | 7/1997 | Qiu | 205/50 |
| 5,851,871 A | 12/1998 | Re | 438/250 |
| 6,325,831 B1 | 12/2001 | Chiavarotti et al. | 29/25.03 |

FOREIGN PATENT DOCUMENTS

| | | | | |
|---|---|---|---|---|
| JP | 62094913 | 5/1987 | | H01G/9/02 |
| JP | 62094914 | 5/1987 | | H01G/9/02 |
| JP | 63069149 A2 | 3/1988 | | |
| JP | 63105962 A2 | 5/1988 | | H01G/9/00 |
| JP | 63304613 A2 | 12/1988 | | H01G/9/04 |
| JP | 401119012 A | 5/1989 | | H01G/9/02 |
| JP | 2241014 A2 | 9/1990 | | H01G/9/02 |
| JP | 6036966 A2 | 2/1994 | | H01G/4/06 |
| JP | 7183172 | 7/1995 | | H01G/9/028 |

OTHER PUBLICATIONS

Donald M. Mattox, "Vacuum Deposition, Reactive Exploration, and Gas Evaporation," *ASM Handbook,* vol. 5, *Surface Engineering,* 1994, pp. 556–581.

Walter J. Bernard et al., "Anodic Oxide Growth on Aluminum in the Presence of a Thin Thermal Oxide Layer," *Journal of Electrochem. Soc.: Electrochemical Science and Technology,* vol. 132, No. 10, Oct. 1985, pp. 2319–2322.

Ashok Chalaha, "Packaging Technology: Integrated Passive Devices," *Passive Component Industry,* Mar./Apr. 2000, pp. 14–16.

\* cited by examiner

ELECTROLYTIC CAPACITORS AND METHOD FOR MAKING THEM

STATEMENT OF RELATED APPLICATIONS

The present application is a continuation-in-part application from International Patent Application No. PCT/IL02/00140 (US) filed Feb. 21, 2002, a continuation-in-part application from U.S. patent application Ser. No. 09/033,664, filed Mar. 3, 1998 (see e.g. U.S. Pat. No. 6,287,673).

FIELD AND BACKGROUND OF THE INVENTION

The present invention relates to a method for making electrolytic capacitors and especially flexible and integrated electrolytic capacitors and capacitors for dynamic RAM (DRAM) applications, and in particular those having a high surface area anode.

An electrolytic capacitor is a capacitor in which one plate is metallic and the other plate is an electrolyte. Intervening between the two plates is a dielectric consisting of a surface oxide coating (e.g. of aluminum oxide) on the metal plate; it is known that the electrostatic capacity of such capacitors may be increased by including a complex oxide such as barium titanate or barium lanthanate with the oxide coating. In this connection, see e.g., Capacitors, Donald M. Trotter, Jr., Scientific American July 1988, pages 58–63, and JP 63304613. Conventionally, the metal plate on which the dielectric coating is formed is referred to as the anode. The term "anode" is used herein to refer both to the metal plate itself and to the combination of the metal plate with the dielectric coating. It will be clear from the context which meaning of "anode" is intended. A transition between ionic conduction in the electrolyte and electronic conduction in an external circuit is provided by a second metal plate, which is referred to herein as the cathode. The anode and the cathode are referred to herein collectively as electrodes. As will be seen from the description of the invention herein, the "plates" are in fact thin films.

Typically, the metal of the electrodes is a valve metal, i.e., a metal which, when oxidized, allows current to pass if used as a cathode, but opposes the flow of current if used as an anode.

As is the case with capacitors generally, the capacitance of an electrolytic capacitor is proportional to the surface areas of its two plates. Conventionally the surface areas of the electrodes are increased by etching, but in the case of thin film electrodes it is questionable whether they are capable of being etched sufficiently to afford the desired increase of surface area, while at the same time maintaining the mechanical integrity of the electrodes.

Vacuum deposition for increasing the surface areas of capacitor electrodes is known. Thus, Kakinoki, et al., in U.S. Pat. No. 4,970,626, describe vacuum deposition of titanium on aluminum foil, at an angle, to produce a titanium surface with a rough, columnar structure. Disadvantages of this method include the large costs of working with relatively thick layers of titanium.

On the other hand, Ohtuka et al. in U.S. Pat. No. 4,763,229 make an aluminum capacitor plate including a sponge-like layer formed by chemical or electrochemical etching, overplated by vacuum deposition of titanium particles. A disadvantage of this method is the additional cost of working with two systems: first etching in electrochemical baths and then sputtering in a vacuum system.

Drake, in U.S. Pat. No. 4,309,810, also teaches vacuum deposition of a metal vapor at a low angle onto a foil substrate, and presents an example of the deposition of aluminum on aluminum to give a columnar structure; however, the product has been found to be too brittle for use in electrolytic capacitors. Neumann et al., in German Patent No. 4,127,743, describe vacuum deposition of aluminum on aluminum in a low pressure oxygen atmosphere to give a surface structure of columns of aluminum separated by aluminum oxide. Allegret et al., in U.S. Pat. Nos. 5,431,971 and 5,482,743, also describe co-deposition, under a low pressure oxidizing atmosphere, of a mixture of aluminum and aluminum oxide. Such mixed $Al/Al_2O_3$ surfaces are more robust mechanically than pure aluminum surfaces, but electrolytic capacitors incorporating them are known to have relatively high resistive losses and relatively low stability over time. In addition, the presence of both aluminum and large quantities of aluminum oxide in the surface of the foil makes subsequent treatments such as conventional chemical or electrochemical stabilization, and structure coarsening by annealing, both difficult and less effective.

Bolz et al., in U.S. Pat. No. 5,571,158, describe a stimulation electrode having a porous surface coating whose active surface area is significantly greater than the surface area defined by the geometric shape of the electrode.

Having formed a metal electrode with high surface area, if the electrode is to be used as an anode, its surface must be oxidized. Conventionally, this is done by electrolytic anodization, in which the electrode is used as an anode in an electrochemical cell. Recent patents in this art include U.S. Pat. Nos. 4,537,665 and 4,582,574 to Nguyen et al., and U.S. Pat. No. 5,643,432 to Qiu. The thicker the oxide layer, the lower the capacitance of the electrolytic capacitor, but the higher the working voltage of the dielectric. For high voltage (upwards of 100V) applications, the dielectric layer is relatively thick, and tends to bridge over fine surface features, reducing the effective surface area of the anode.

Two other phenomena tend to reduce the effective surface areas of anodes made by electrolytic anodization. One is that in the course of the anodization process, oxygen and hydroxide ions migrate from the metal-dielectric interface into the metal, while metal ions migrate from the metal-dielectric interface into the dielectric. The other is that sharp points on the metal surface are characterized by high local electric fields, which accelerate the electrolytic process. Both of these phenomena tend to smooth out irregularities in the metal-dielectric interface.

It is also known to use TCNQ complexes as solid electrolytes, and to coat them on electrolytically anodized metal surfaces by vapor deposition techniques (see e.g., JP 6036966, and JP 62094912, -3 and -4). In JP 63069149, polyethylene oxide and a lithium salt are vapor deposited on a substrate for use as a solid electrolyte.

However, in general terms a solid electrolyte need not be TCNQ and it need not be vapor deposited. In JP 7183172 and JP 2241014, capacitors are made by dipping capacitor elements in molten TCNQ complex salt, or in a solution thereof, respectively. In U.S. Pat. No. 4,090,231 (Millard et al.), a capacitor is made by sequentially screen printing on a valve metal (e.g. Ta) substrate, a mixture of valve metal (e.g. Ta) powder plus binder, sintering the printed layer, forming a dielectric oxide, applying a solid manganese dioxide electrolyte layer, and forming a counter electrode. In JP 63105962 a thin film of solid electrolyte, said to have superior ionic conductivity, and selected from RbCl, RbI, KCl, KI, CuCl and CuI, is deposited on a copper plate by thermal evaporation.

It is also known to form a plurality of capacitors on a single substrate, see e.g. the above-mentioned Millard et al.

patent, in which a high surface area is provided by a porous pad with a rough outer surface of valve metal being sinter-bonded to valve metal substrate t-face, as well as U.S. Pat. No. 5,357,399 (Salisbury), in which a solid electrolyte film is connected electrically and mechanically to a metallic member parallel to and substantially coextensive with a metallic substrate, and any voids in the capacitor may contain injected insulating material. In Salisbury, a large capacitance is provided as a result of a large surface area of metal within a sintered porous mass; a disadvantage of this technology is the complicated method of creating large surface area and more especially the high temperature involved, which makes it incompatible with other integrated passive components technologies.

In recent years, integrated passive devices such as capacitors have assumed an ever-increasing importance, particularly in order to make the most advantageous use of small areas, where, by contrast, conventional use of numerous discrete passive components is at a distinct disadvantage (see e.g., "Packaging Technology: Integrated Passive Devices", A. Chalaka, *Passive Component Industry*, March/April 2000, Vol. 2, No. 2, 14–16).

In U.S. Pat. No. 5,851,871 (Re), there is described an integrated capacitor typically comprising a "sandwich" formed by two layers of suitably doped polycrystalline silicon separated by a film or thin layer of silicon oxide; one of the silicon layers can be replaced by aluminum.

In U.S. Pat. No. 5,589,416 (Chittipeddi), there is described an integrated capacitor comprising a polysilicon/silicon dioxide/TiN combination.

U.S. Pat. No. 4,453,199 to Ritchie et al. describes a method of forming, by vapor deposition or the like, discrete plain (i.e. not rough) electrode areas on insulating substrates, and depositing a dielectric layer over the electrodes and the areas between the electrodes.

To the best of the present inventors' knowledge, a high specific surface area vapor deposited valve metal film has not been previously suggested as the anode in an integrated electrolytic capacitor, nor when this is combined with a vapor-deposited film of solid electrolyte, nor when combined with an oxide layer produced by plasma anodizing and a vapor-deposited film of solid electrolyte.

Moreover, to the best of the inventors' knowledge, the combination of a vapor deposited anode with a vapor deposited electrolyte has not been previously suggested even as a basis for standard wound (i.e. not integrated) electrolytic capacitors, still less when combined with an oxide layer produced by plasma anodizing.

There is a widely recognized need for improved and economically viable methods of manufacturing high capacitance compatible with other thin film technologies for integrated passive devices, and for mechanically robust integrated electrolytic capacitors.

There is also a widely recognized need for creating standard wound electrolytic capacitors by a method involving a minimum number of technological operations, or in which all or almost all layers are made by vapor deposition.

The present invention is believed to make a significant contribution in fulfilling these needs.

The entire contents of the patents and other publications mentioned herein, including issued patents corresponding to U.S. Ser. No. 09/033,664, are deemed to be incorporated by reference in the present patent application.

SUMMARY OF THE INVENTION

The present invention provides, in one aspect, a method for making an integrated electrolytic capacitor, wherein a substrate is coated with at least one sequence of each of the following layers: a vacuum deposited film having a high specific surface area, which is selected from the group consisting of valve metals and mixtures of valve metals with valve metal oxides; superimposed on the film having a high specific surface area, at least one dielectric film comprising a substance selected from the group consisting of valve metal oxides, their complex oxides with at least one rare earth metal and their complex oxides with at least one alkaline earth metal; and a solid electrolyte film superimposed on the at least one film. It will be appreciated that applying more than one sequence of layers will afford a capacitor with a progressively increasing capacitance.

In another aspect, the invention provides a method for making an integrated electrolytic capacitor, wherein a substrate is coated with at least one sequence of each of the following layers: a vacuum deposited film having a high specific surface area, the film being selected from the group consisting of valve metals and mixtures of valve metals with valve metal oxides; superimposed on the film having a high specific surface area, at least one film of an oxide applied by electrolytic anodization, of at least one valve metal present in the vacuum deposited film having a high specific surface area; and a solid electrolyte film superimposed on the at least one film.

In still another aspect, the invention provides a method for making an integrated electrolytic capacitor, wherein a substrate is coated with each of the following layers: a vacuum deposited film of high specific surface area, which has a fractal surficial structure including both a valve metal and an oxide thereof, provided that where the valve metal is aluminum and the film having a high specific surface area contains no more than about 30.3% of the total aluminum as aluminum oxide; superimposed on the film having a high specific surface area, at least one film of an oxide applied by electrolytic anodization, of at least one valve metal present in the vacuum deposited film having a high specific surface area; and a solid electrolyte film superimposed on the at least one film.

In yet another aspect, the invention provides a method for making an integrated electrolytic capacitor, wherein a substrate is coated with each of the following layers: a vacuum deposited film of high specific surface area, which is selected from the group consisting of valve metals and mixtures of valve metals with valve metal oxides; superimposed on the film a discontinuous non-anodized layer of an oxide of a valve metal; and a solid electrolyte film superimposed on the at least one film.

In a further aspect, the invention provides a method for making a plurality of integrated electrolytic capacitors, wherein pre-designated areas in a planar metallic substrate are each coated with at least one sequence of each of the following layers: a vacuum deposited film having a high specific surface area, which is selected from the group consisting of valve metals and mixtures of valve metals with valve metal oxides; superimposed on the film having a high specific surface area, at least one dielectric film comprising a substance selected from the group consisting of valve metal oxides, their complex oxides with at least one rare earth metal and their complex oxides with at least one alkaline earth metal; and a solid electrolyte film superimposed on the at least one film; connecting electrically and mechanically the solid electrolyte film in each of the pre-designated areas with a metallic member parallel to the substrate; if desired injecting insulating material into the voids between each pre-designated area; and thereafter cutting through the substrate and the metallic member, and the insulating material if present, in order to separate from each other the thus-formed capacitors.

Also included in the present invention is an integrated electrolytic capacitor which comprises at least one sequence of each of the following layers coated on a substrate: a non-anodized vacuum deposited film having a high specific surface area, which is selected from the group consisting of valve metals and mixtures of valve metals with valve metal oxides; superimposed on the film having a high specific surface area, at least one dielectric film comprising a substance selected from the group consisting of valve metal oxides, their complex oxides with at least one rare earth metal and their complex oxides with at least one alkaline earth metal; an optional additional metal oxide film formed by electrolytic anodization and superimposed on the at least one film; and a solid electrolyte film superimposed on the at least one film, or additionally or alternatively on the additional metal oxide film if present.

Also included in the present invention is a wound capacitor, which comprises a vacuum deposited film having a high specific surface area, and superimposed thereon a vacuum deposited solid electrolyte film.

In a particular embodiment, the integrated electrolytic capacitor of the invention comprises a substrate coated with each of the following layers: a vacuum deposited film of high specific surface area, which has a fractal surficial structure including both a valve metal and an oxide thereof; superimposed on the film having a high specific surface area, at least one film of an oxide applied by electrolytic anodization, of at least one valve metal present in the vacuum deposited film having a high specific surface area; and a solid electrolyte film superimposed on the at least one film.

In another embodiment, the integrated electrolytic capacitor of the invention comprises an electrically conductive substrate; a dielectric coating, on the surface of the substrate, having a bimodal morphology, in that the coating includes both a non-electrolytically formed valve or other metal oxide layer and an electrolytically formed valve metal oxide layer, wherein the non-electrolytically formed layer is homogeneous and the electrolytically formed layer is increasingly porous towards its outer surface; a solid electrolyte film superimposed on the dielectric coating; and an optional vacuum deposited metal film superimposed on the solid electrolyte film.

The present invention still further includes a method for making an electrolytic capacitor, wherein a metallic foil substrate is coated with at least one sequence of each of the following layers: a vacuum deposited film having a high specific surface area, which is selected from valve metals and mixtures of valve metals with valve metal oxides; superimposed on such film having a high specific surface area, at least one dielectric film comprising a substance selected from valve metal oxides, their complex oxides with at least one rare earth metal and their complex oxides with at least one alkaline earth metal; and a solid electrolyte film superimposed on said at least one film; provided that this method includes at least one of the following features: forming the at least one dielectric film by a procedure selected from vacuum deposition and plasma anodic oxidation; and/or forming the solid electrolyte film by vacuum deposition.

Also included in the invention is a capacitor comprising a metallic foil substrate which is coated as set forth in the preceding paragraph.

BRIEF DESCRIPTION OF THE DRAWINGS

The invention is illustrated by way of example only, with reference to the accompanying drawings, wherein.

DEFINITIONS

In the present specification and claims, the following definitions apply:

a valve metal means any one or more of aluminum, titanium, tantalum, niobium, zirconium, silicon, thorium, cadmium and tungsten;

an alkaline earth metal means any one or more of magnesium, calcium, strontium and barium;

a rare earth metal means any one or more of scandium, yttrium, lanthanum and the elements of atomic numbers 58–71;

anodization means liquid phase electrolytic anodic oxidation;

plasma anodic oxidation means gas phase plasma anodic oxidation (which is also known outside the present application as "plasma anodization").

DETAILED DESCRIPTION OF THE INVENTION

The substrate used in the method of the invention may be made from any suitable material including metals and polymers. As mentioned above, however, the preferred substrate is one which is adapted to be used as a printed circuit board substrate. Printed circuit boards and substrates used therefor are very well known, and per se do not form an innovative part of the present invention.

According to a preferred embodiment of the present inventive method, in order to form the high specific area film, a valve metal such as aluminum is evaporated onto a substrate in a low pressure, preferably anhydrous, atmosphere of an inert gas (e.g. having a pressure in the range between about $10^{-3}$ torr and about $10^{-2}$ torr), preferably in the presence of a still lower, e.g. by between one and two orders of magnitude lower, pressure of oxygen. In a particular embodiment, the high specific area film may have a cauliflower-like morphology. The inert gas may be any gas that does not react with the valve metal under the process conditions, including noble gases such as helium and argon.

In the experiments described herein, the valve metal is aluminum and the inert gas is nitrogen. In a particular embodiment, oxygen is introduced into the inert atmosphere prior to the evaporating of the at least one valve metal, and preferably the substrate is heated to between about 350° C. and about 550° C. during the evaporating of the at least one valve metal.

According to a preferred embodiment, the thus-formed valve metal film has a fractal structure, with a fractal dimension greater than 2. Capacitors made according to this embodiment of the method of the invention, where the anode is based on such valve metal film (which may then be coated with a film of e.g. an oxide of the same or different valve metal) and/or a cathode produced preferably by a similar vapor deposition procedure and having preferably a similar structure, will have a higher capacitance than prior art cathodes of similar bulk composition and overall dimensions. It may be noted that in thus-produced anodes, the fractal surficial structure allows the deposition (if desired) of relatively thick dielectric layers (e.g. a valve metal oxide) while preserving the surface area of the metal surface.

Because according to the invention, the high specific area film is provided by vapor deposition, increasing the surface area of a valve metal anode does not involve removing material (as e.g. in etching), and because the cathode is also made by vapor deposition (and thus, preferably also the other layers mentioned herein), the result is that capacitors having desirable relatively thinner electrodes may be obtained according to the method of the invention.

As already implied by what has been stated above, the fractal surficial structure may be formed on any substrate, including nonmetallic and even insulating substrates. This applies to the high specific area film of the anode, and/or to the valve metal film of the cathode, vacuum deposited on the solid electrolyte film.

According to the present invention, there is deposited on the first valve metal film, preferably a valve metal oxide film, optionally as a discontinuous surface layer. If the surface of the first valve metal film is rough, then to the extent that sharp points on the surface are covered by the oxide (etc.) thus deposited, those points are isolated from the surface-area-reducing effects of the optional subsequent electrolytic anodization. On smooth portions of an otherwise rough foil electrode surface in between the sharp points, the subsequent optional electrolytic anodization takes place predominantly on portions of the surface left exposed after the deposition, thereby actually increasing the area of the metal-dielectric interface. The described optional electrolytic anodization gives an anode with its dielectric layer having a bimodal morphology, insofar as the non-electrolytically formed, preferably discontinuous layer is homogeneous, whereas the electrolytically formed layer is increasingly porous towards its outer surface, the pores being predominantly cylindrical and perpendicular to the outer surface.

The non-electrolytically formed surface oxide layer is preferably deposited by evaporation, either of the valve metal in presence of low pressure oxygen, or of the valve metal oxide itself. In either embodiment, it is preferable although not essential, that the valve metal of the high specific area film be the same as the valve metal of the dielectric film.

The capacitor according to the invention—or made according to the method of the invention—includes, superimposed on the film having a high specific surface area, at least one dielectric film comprising a substance selected from the group consisting of valve metal oxides, their complex oxides with at least one rare earth metal and their complex oxides with at least one alkaline earth metal (e.g. magnesium, strontium or barium titanate). The dielectric may consist of one or a plurality of films in which the said complex oxides form one or more separate layers or are intermixed with valve metal oxide(s) and includes also the case where the dielectric contains valve metal oxide(s) e.g. aluminum oxide together with e.g. an alkaline earth/rare earth complex oxide such as barium lanthanate.

The at least one dielectric film may be formed e.g. by a procedure selected from: plasma anodic oxidation; evaporating at least one valve metal onto the vacuum deposited film having a high specific surface area, in an oxidizing atmosphere, evaporating the oxide directly onto the vacuum deposited film having a high specific surface area, and thermally oxidizing the vacuum deposited film having a high specific surface area. In a particular embodiment, the dielectric film may be formed as a discontinuous layer.

Optionally, there may be formed an additional metal oxide film by electrolytic anodization, between the at least one dielectric film and the solid electrolyte film. Preferably, at least one metal film is vacuum deposited onto the solid electrolyte film.

The valve metals in the various layers are selected independently from the list defined above and therefore may be the same (e.g. either aluminum or tantalum) or different, e.g. one or more layers of aluminum with one or more layers of tantalum.

In a preferred embodiment, the present method comprises forming the at least one dielectric film by a procedure selected from vacuum deposition and plasma anodic oxidation, and/or forming the solid electrolyte film by vacuum deposition. However, it is presently more preferred to form the at least one dielectric film by a procedure selected from vacuum deposition and plasma anodic oxidation, and to form the solid electrolyte film by vacuum deposition, so that, without prejudice to embodiments of the invention which include electrolytic anodization, it is presently particularly preferred to carry out all steps in the present method in the gas phase.

As an alternative embodiment to the fractal surficial structure which has been mentioned above, the film having a high specific surface area may be vacuum deposited under such conditions that it has a columnar structure.

The various aspects and embodiments of the method of the invention which have been described above, apply correspondingly, where the context is relevant, to the capacitor which per se forms a constituent part of the present invention.

In a particular embodiment of the present capacitor, the substrate is a planar metallic substrate, the solid electrolyte film is connected electrically and mechanically to a metallic member parallel to and substantially coextensive with the substrate, and the capacitor contains, if desired, injected insulating material in any internal or external voids, if present.

DESCRIPTION OF THE PREFERRED EMBODIMENTS

The principles and operation of the production of foil electrodes in relation to particular embodiments of the present invention may be better understood with reference to the drawings and the accompanying description.

The techniques of vacuum deposition, reactive evaporation and gas evaporation, which may be used in the method of the present invention, are well-known in the art and do not per se constitute the present invention. See, for example, D. M. Mattox, "Vacuum Deposition, Reactive Evaporation and Gas Evaporation", ASM Handbook, Volume 5: Surface Engineering, 1994, pp. 556–581. Any suitable method may be used to evaporate the valve metal(s), for example, thermal resistive evaporation, electron beam evaporation and sputtering.

EXAMPLE 1

Deposition of Fractal Aluminum Surfaces

Aluminum was evaporated, by thermal resistive evaporation, onto clean aluminum foil substrates held at a temperature of 300° C. in an anhydrous atmosphere of nitrogen at a pressure of between 0.002 torr and 0.005 torr and oxygen at pressures between 0.0002 torr and 0.0005 torr. The deposition rate was about 300 Å/sec.

Figure 1A:
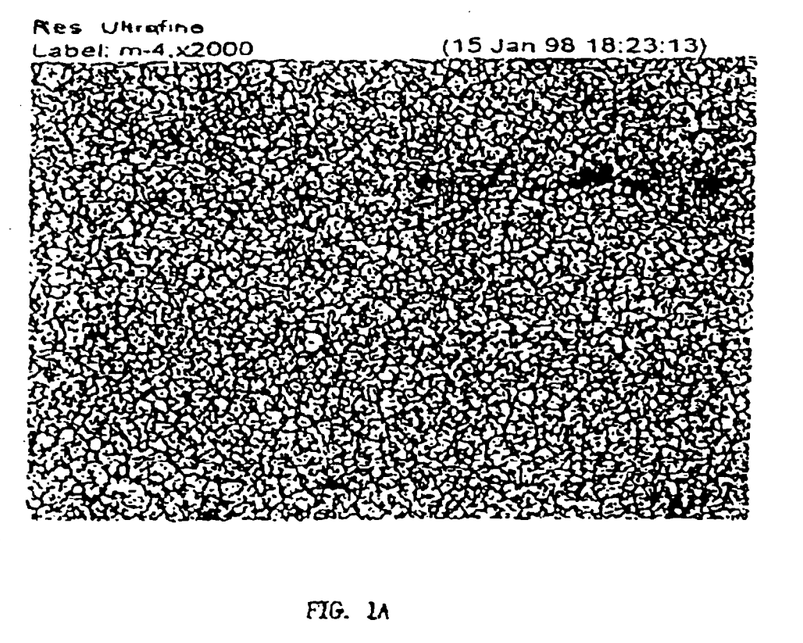
FIG. 1A is a photomicrograph of an aluminum surface of an anode or cathode according to an embodiment of the present invention at a magnification of 2000.
Figure 1B:
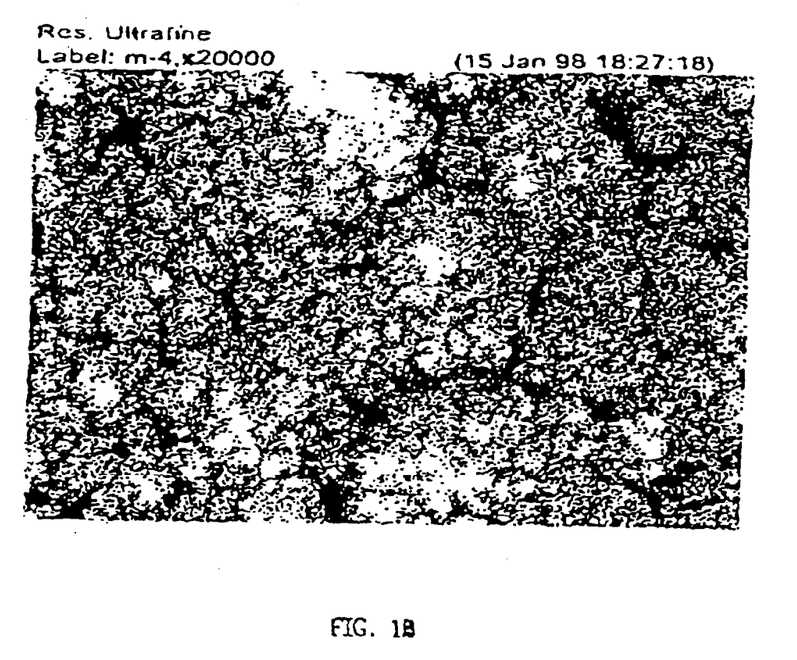
FIG. 1B is a photomicrograph of the surface of FIG. 1A at a magnification of 20,000.

FIGS. 1A and 1B are photomicrographs of a fractal aluminum surface so prepared. This surface has a cauliflower-like morphology, as described for materials other than valve metals as defined herein, by Bolz et al., in U.S. Pat. No. 5,571,158. In the present Example, the "cauliflower heads" are about 2 microns across. The "florets" are about 0.2 microns across, so that the surface is self-similar at least on a distance scale from 0.2 microns to 2 microns. This is confirmed by the visual appearance of the surface. Unlike electrodes with more than 50% aluminum oxide content, e.g., the electrode of Allegret et al., or the electrode of Neumann et al., which are black and shiny (specularly reflective), this surface is black matte (diffusely reflective), showing that this surface has a fractal structure on the length scale of the wavelengths of visible light.

The following is an EDS elemental analysis of one of the surfaces N 1.18%; O 30.43%; Al 66.38%; P 1.79%; Ar 022%. It follows from the stoichiometry that 30.3% of the aluminum was in the form of $Al_2O_3$ and 69.7% was in the form of aluminum metal.

For the purpose of creating anodes for electrolytic capacitors, it is preferable that the aluminum be deposited to a thickness of between about 3 microns and about 6 microns. The preferred range of oxygen pressures is between one and two orders of magnitude less than the nitrogen pressure. Less oxygen than this produces electrodes of inferior mechanical strength, while more oxygen produces capacitors of lower capacitance, because excessive aluminum oxide is included with the aluminum.

Figure 2:
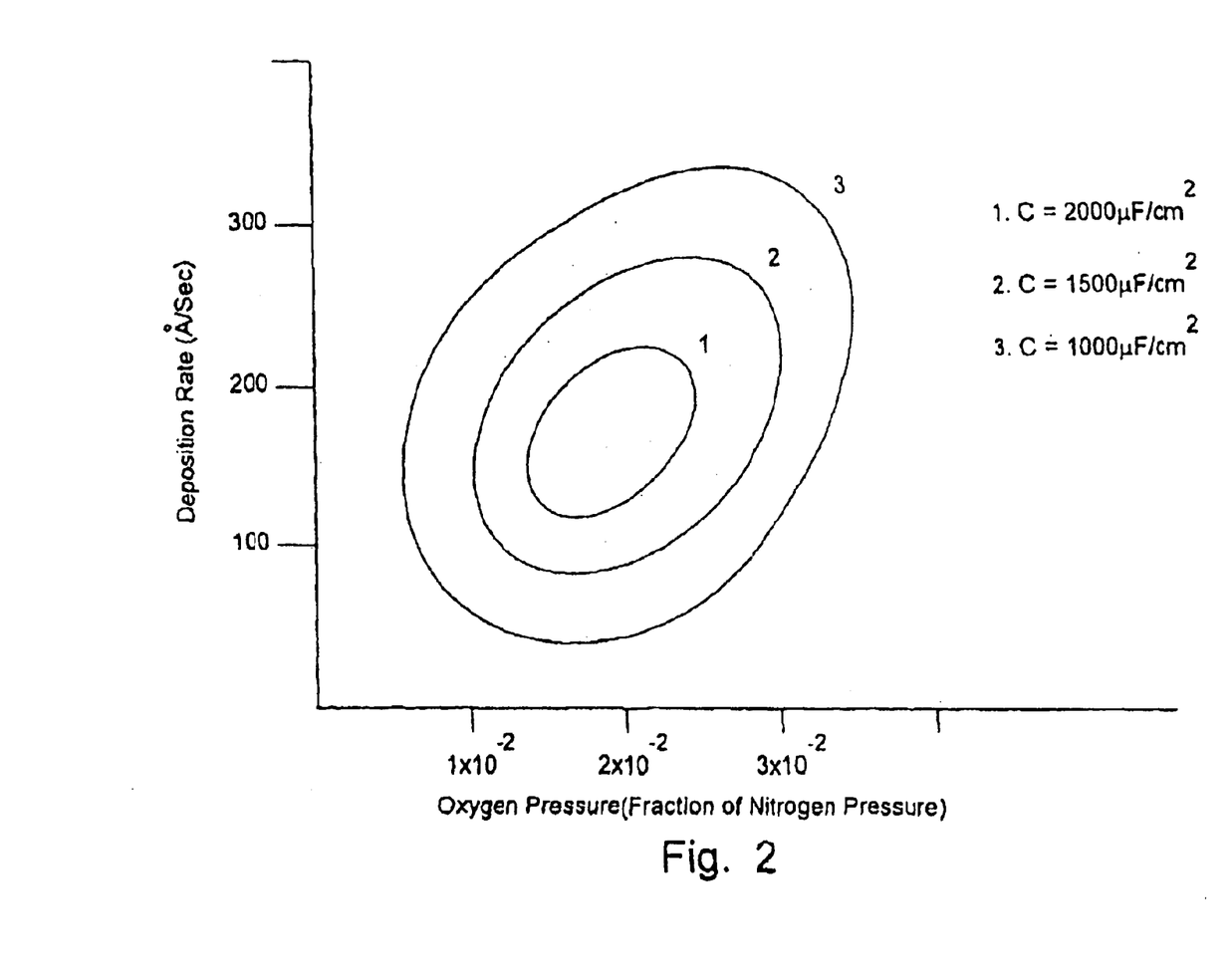
FIG. 2 is a contour plot of capacitance vs. oxygen pressure (as a fraction of nitrogen pressure) and aluminum deposition rate.

FIG. 2 is a contour plot of the capacitance C of cathodes so produced, under nitrogen pressures between 0.002 torr and 0.004 torr, as a function of aluminum deposition rate, and as a function of oxygen pressure, expressed as a fraction of nitrogen pressure.

The capacitances of FIG. 2 were measured in an ethylene-glycol-based electrolyte having a conductivity of 8:5 Ω-cm. As noted above, the cathodes were prepared by thermal resistive evaporation. Electron beam deposition would provide a faster deposition rate and would have different optimum process parameters.

The cathodes of FIG. 2 were prepared by evaporating aluminum onto only one side of the aluminum foil substrates. If aluminum had been evaporated onto both sides of the substrates, the capacitances would have been doubled.

Holding the substrates at a temperature of 330° C. to 550° C. during the evaporation thereon of the aluminum tends to produce relatively coarse surface structures that are more resistant to dielectric over-bridging than the finer surfaces obtained at lower temperatures. Alternatively, the surfaces may be coarsened by annealing at 330° C. to 550° C. under a reduced pressure of between about $10^{-4}$ torr and about $10^{-5}$ torr subsequent to evaporation. This annealing is more effective on the fractal surfaces according to a preferred embodiment of the present invention than on the columnar surfaces of Neumann et al. because the excessive aluminum oxide in the surface of Neumann et al. inhibits the coarsening associated with annealing. Annealing is also more effective on the surfaces of the present invention, which in a particular embodiment may include up to about 30% aluminum oxide, than on the surfaces of Allegret et al., which include more than 50% aluminum oxide.

It will be readily appreciated that the method of the present invention may be used to co-deposit other valve metals on the substrate, particularly titanium and tantalum, the oxides of which have higher dielectric constants than aluminum and therefore give the electrolytic capacitor a higher capacitance.

Figure 3A:
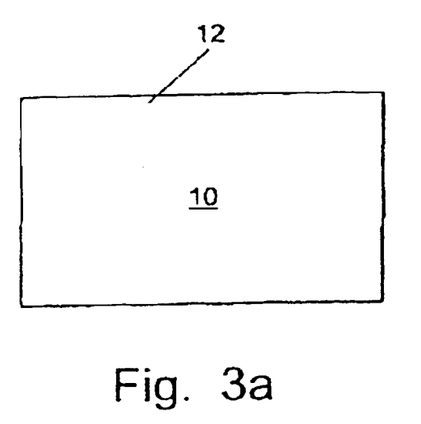
FIG. 3A is a schematic cross-section of an aluminum foil with a smooth surface.
Figure 3B:
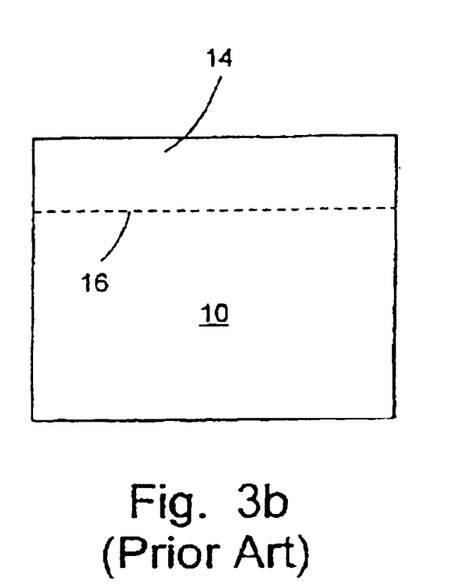
FIG. 3B (prior art) is a schematic cross-section of the foil of FIG. 2A anodized conventionally.
Figure 3C:
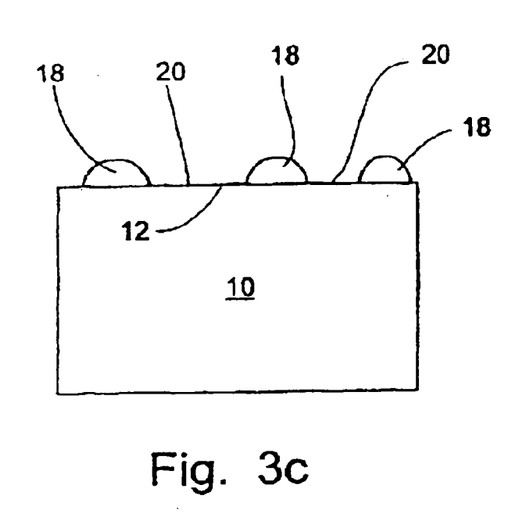
FIG. 3C is a schematic cross-section of the foil of FIG. 2A with a discontinuous surface deposit of aluminum oxide.
Figure 3D:
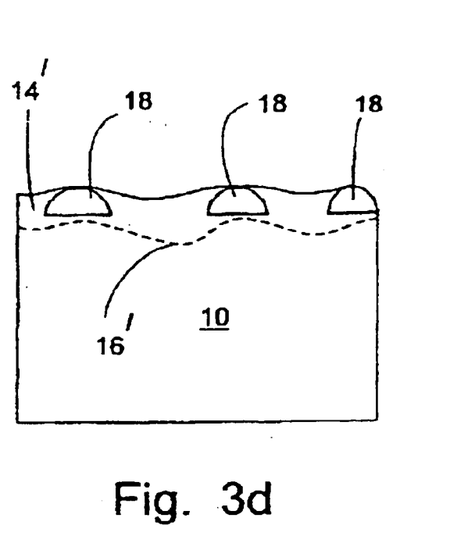
FIG. 3D is a schematic cross-section of the foil of FIG. 2C after anodization.

Referring again to the drawings, FIGS. 3A through 3E illustrate the principle of a particular embodiment of the present invention as regards increasing the surface area of the interface between a valve metal film and an overlying oxide dielectric layer in an anode. FIG. 3A shows, schematically, a cross-section of an aluminum foil 10 with a smooth, flat upper surface 12. FIG. 3B shows foil 10 after anodizing, with a dielectric layer 14 of aluminum oxide now present on interface 16. Because layer 14 was formed by a combination of outward migration of aluminum ions and inward migration of oxygen ions, interface 16 is lower into foil 10 than original surface 12; but, because the anodization process takes place uniformly on surface 12, interface 16 preserves the flat shape of surface 12. FIG. 3C shows foil 10 after the deposition thereon of regions 18 of a discontinuous layer of aluminum oxide, separated by gaps 20. FIG. 3D shows foil 10 after deposition and subsequent anodizing to form a dielectric layer 14' of aluminum oxide. Because anodizing proceeds preferentially in gaps 20, interface 16' between foil 10 and layer 14' is not flat.

Figure 3E:
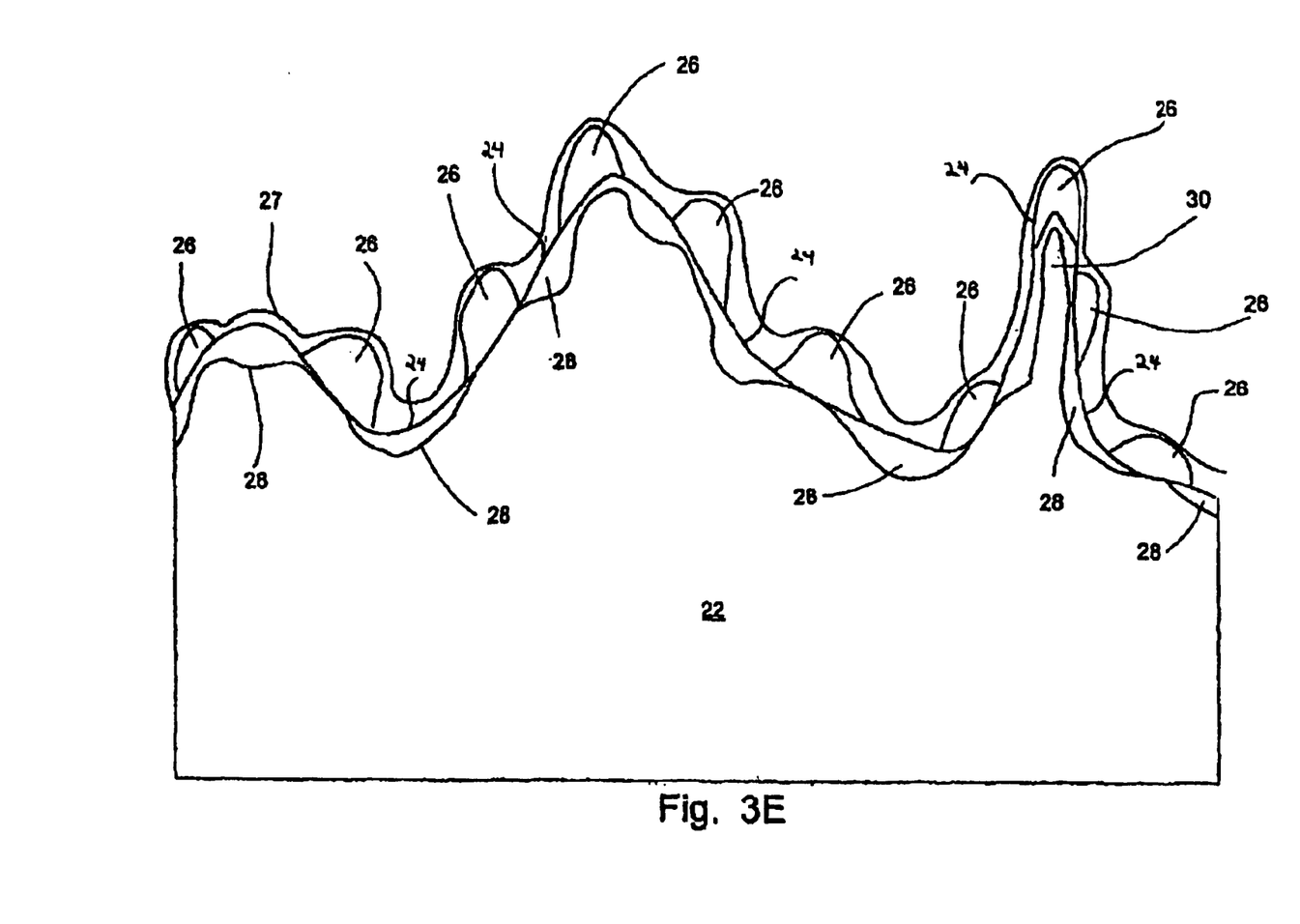
FIG. 3E is a schematic cross-section of an aluminum foil with a rough surface, after deposition of a discontinuous surface oxide deposit and after anodization.

FIG. 3E shows schematically another aluminum foil 22, the upper surface of which 24 has been roughened, for example by depositing thereon a layer of a valve metal such as aluminum by the preferred vapor deposition method according to the present invention, or by conventional etching of the upper surface. Moreover, a discontinuous layer of valve metal oxide has been deposited on surface 24 in accordance with the present invention. This discontinuous layer consists of discrete regions 26 deposited at random on surface 24. Some of regions 26 cover peaks, such as peak 30, in surface 24, protecting those peaks from subsequent degradation when a more continuous dielectric layer grows downward into foil 22 in the course of anodization. The layer formed by anodization has two portions, a lower barrier portion 28 and an upper portion 27. There is a vertical porosity gradient from lower portion 28 to upper portion 27, the pores being predominantly cylindrical and vertical and predominantly in portion 27. This porosity gradient provides a morphological distinction between anodized portions 27,28 and the relatively homogeneous regions 26. This morphological distinction is enhanced if, prior to anodization, the foil with the discontinuous oxide layer is annealed thermally, to make the discontinuous layer denser and stronger. An example of a thermal annealing protocol is heating to 450° C. for 30 minutes under pure oxygen at a pressure of $5\times10^{-3}$ torr. In addition, a thermal oxide layer may be formed above and/or in between regions 26, as described by W J. Bernard and S. M. Florio, in "Anodic Oxide Growth on Aluminum in the Presence of a Thin Thermal Oxide Layer", J Electrochem. Soc.: Electrochemical Science & Technology, Vol. 132, No. 10, October 1985, pp. 2319–2322.

Preferably, the discontinuous layer is deposited to a thickness equal to or slightly less than the thickness of the layer formed by anodization, and with a density and porosity comparable to the density and porosity of the barrier portion of the anodized layer. In this way, portions 27 and 28 that grow on the peaks on the valve metal surface are relatively thin, as illustrated in FIG. 3E. As in the prior art, the thickness of the layer formed by anodization is between 10 and 15 Å/V, where V is the forming voltage, which is generally between 1.5 and 2 times the working voltage of the final capacitor.

EXAMPLE 2

Deposition of Discontinuous Aluminum Oxide Layer

Aluminum foils with fractal surfaces were prepared as in Example 1, except that the foils were heated as described above during evaporation of the aluminum to promote the formation of coarser surface structures. On each foil, a discontinuous layer of aluminum oxide, 500 Å to 2000 Å thick, was deposited by thermal resistive evaporation of aluminum in a pure oxygen atmosphere, at oxygen pressures of between 0.0015 torr and 0.007 torr. This deposition was effected in the same chamber as that in which the foil was prepared, to avoid uncontrolled oxidation in ambient air. Layer thicknesses were measured as described by Mattox on page 569. Simple electrical resistance measurements transverse to the foils using dry probe electrodes showed that the foils had negligible resistance to the transverse flow of electricity (short circuit), showing that the aluminum oxide layers were indeed discontinuous. By contrast, a foil on which aluminum oxide was deposited to an estimated thickness of greater than 1 micron had negligible transverse conductance.

As an alternative to evaporation of aluminum in an oxidizing atmosphere, aluminum oxide may be evaporated directly onto foil 10. The direct evaporation of refractory oxides such as aluminum oxide has the disadvantage of requiring more heat than evaporation of the corresponding metals. It will also be appreciated that other valve metal oxides, such as titanium oxide, may be deposited in discontinuous layers above discontinuous aluminum oxide layer 18. If this supplemental deposition is effected by evaporating the further valve metal in an oxygen atmosphere, the preferred oxygen pressure is e.g. between 0.003 torr and 0.007 torr, of the same order of magnitude as in the case of evaporation of aluminum.

Figure 4:
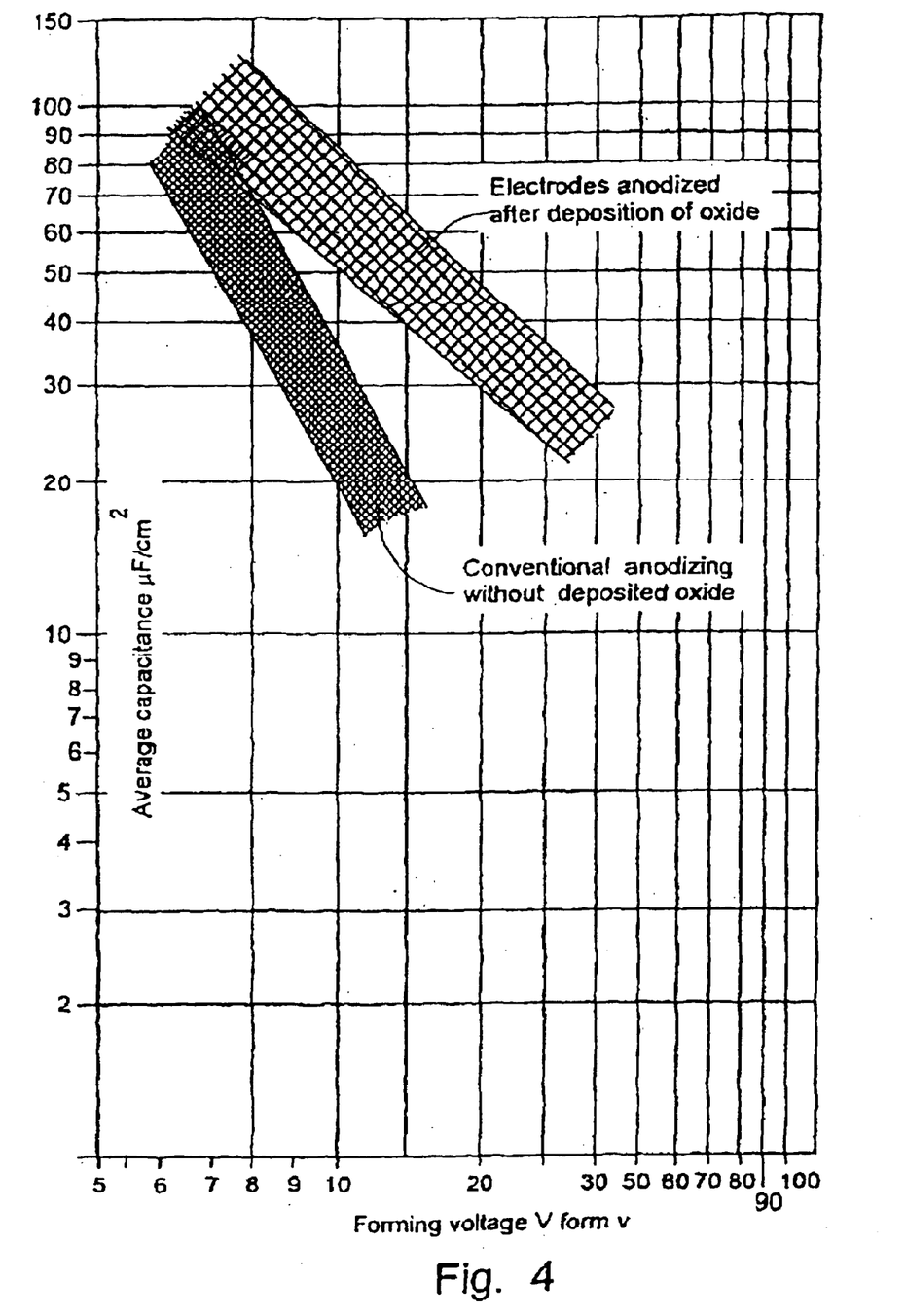
FIG. 4 compares capacitances of prior art anodes with capacitances of anodes for use according to an embodiment of the present invention.

FIG. 4 compares the range of capacitances obtained for aluminum foil anodes, followed sequentially by discontinuous deposition of aluminum oxide and standard electrolytic anodization, with the range of capacitances obtained for aluminum foil anodes prepared only by standard electrolytic anodization. In both cases the aluminum foils were first processed as described above to provide the foils with fractal surfaces. The anodization was performed in an ethylene glycol based electrolyte at a temperature of 55° C. and a current density of 5 mA/cm$^2$. At forming voltages greater than about 8 volts, capacitors made from anodes prepared according to a preferred embodiment of the present invention have higher capacitances than corresponding capacitors which incorporate prior art anodes.

EXAMPLE 3

Figure 5:
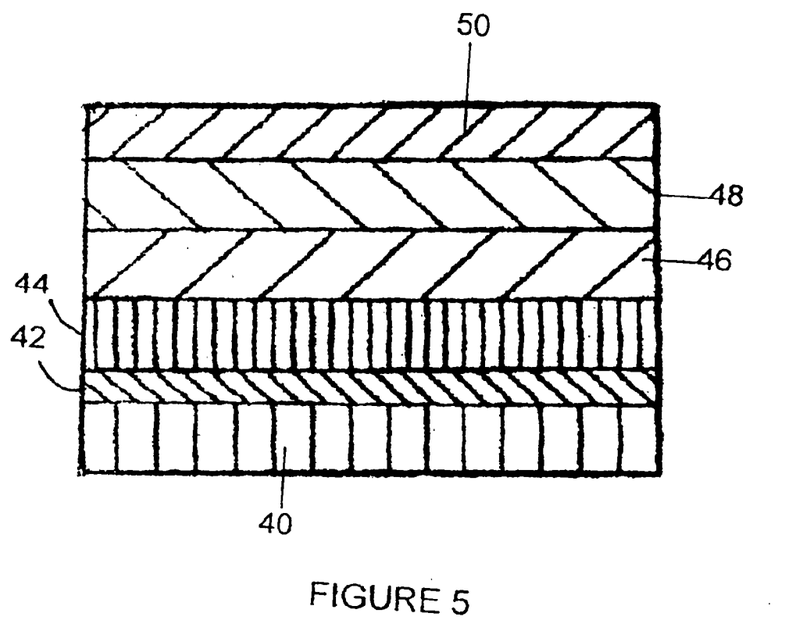
FIG. 5 is a schematic cross-section of a capacitor made according to an embodiment of the present invention.

Capacitors (a) A particular embodiment of the invention may be illustrated in FIG. 5, according to which there is shown in schematic cross-section, a capacitor made according to an embodiment of the present invention, in which the thicknesses of the various films or layers are not shown to scale. Reference numeral 42 is the first valve metal film having a high specific surface area, provided on substrate 40, and coated with film 44 of an oxide of a second valve metal by vacuum deposition. Oxide film 44 is optionally electrolytically anodized to give a further oxide layer 46, whereby the combined oxide layers 44+46 have a bimodal morphology as described herein. A solid electrolyte film 48 is deposited by vacuum deposition on film 44 in absence of the optional anodization step, or on layer 46 if anodization has been carried out. Finally, there is deposited in vacuum a third valve metal film 50, intended to function as cathode, on the vapor deposited solid electrolyte film 48.

(b) In this Example, FIG. 5 is used to illustrate a different embodiment of the invention from that described in the preceding paragraph (a). Substrate 40 may be of metal, ceramic or alternatively e.g. alumina having a thin film of metal sputtered on its surface, or a polyimide (e.g. in the case of a flexible wiring board), or other suitable material. After thorough cleaning, on the upper surface of the substrate 40 there is deposited layer 42 of a good electrical conducting material such as tantalum, aluminum, or niobium. The layer thickness is for example 5,000–9000 A. This layer may be deposited by a number of alternative processes including cathodic sputtering and vacuum deposition. A layer with high specific surface 44 is then formed as described elsewhere herein; it should however be noted that the first metallic layer 42 may not be required since the high specific surface area layer may have sufficient conductivity, depending on specific requirements.

If needed and in accordance with the circuit design, the metallic layer 42 coated with high specific surface area layer 44 may be masked by a known photoresist technique and etched to produce a plurality of metallic electrodes. Alternatively, these electrodes may be formed by techniques other than the photoresist masking technique, such as e.g. ion beam machining. In the description which follows it will be appreciated that only essential layers will be described, without mentioning standard masking technological steps, which a person of the art will appreciate may be carried out additionally, in known manner.

A dielectric layer 46 is then formed on the entire surface of each electrode by anodizing the high specific surface area of the electrodes. In a particular embodiment, a plasma anodization process may be suitable for carrying out this step, as is fully described in U.S. Pat. No. 3,556,966 issued Jan. 19, 1971 to Waxman and Zaininger. This is essentially a low temperature process carried out at temperatures of about 50° C. or less. For anodization of aluminum, more exact parameters are given in an article in Solid State Technology, April 1971, pages 27–31, entitled "plasma Grown AL2O3 for COS/MOS Integrated Circuits" by Micheletti, Norris, and Zaininger.

In a different embodiment, the electrodes are anodized in an appropriate electrolyte, such as for example 0.01% solution of citric acid. However, plasma anodization is presently believed to minimize contamination.

A layer of solid electrolyte 48 is then applied by ion beam assisted deposition for example as follows. The ion source was set in the chamber so that an ion beam can bombard the substrate at an arbitrary angle from the normal axis to the substrate. The layer of solid electrolyte was obtained by ion beam assisted thermal evaporation of 7,7,8,8-tetracyanoquinodimethane (TCNQ complex) from ceramic crucibles on the anodized (oxidized) high specific surface area electrodes. The chamber was pumped down to $1\times10^{-5}$ torr, then argon gas was allowed in until a pressure of $1\times10^{-4}$ was achieved. Ion beam energy is varied in the range 100 eV–600 eV and ion current density may be in the range from 100 nA/cm² to 1 µA/cm².

Next, a layer of Ag paste 50 is applied over the TCNQ complex layer; however, it is also possible to produce the Ag layer by vacuum deposition.

In alternative embodiments, there may be applied as layer 48 a manganese-containing layer or a conductive polymer layer, instead of the TCNQ complex layer.

Application of the manganese-containing layer is typically performed by dipping the electrode with oxide layer in a solution of manganous nitrate and heating the impregnated device in a moist atmosphere to convert the nitrate to a solid conductive manganese dioxide. On top of the manganese dioxide electrolyte, a counter-electrode 50 is constructed of successive layers of graphite (carbon), silver, and solder.

It may be noted that compared to, for example, U.S. Pat. No. 4,090,231, where a highly porous layer or pad of tantalum is sinter bonded to the tantalum substrate at a temperature between 1550° C. and 2000° C., in the present invention all processes are effected at low temperatures. This affords the great advantage of utility especially for manufacturing capacitors on flexible wiring board- flexible electrolytic capacitors. Such flexible boards are frequently made from polyimide ("Kapton") substrate, which can withstand temperatures of up to about 250° C.

While the present invention has been particularly described with reference to certain embodiments, it will be apparent to those skilled in the art that many modifications and variations may be made. The invention is accordingly not to be construed as limited in any way by such embodiments, rather its concept is to be understood according to the spirit and scope of the claims.

What is claimed is:

1. A method for making at least one electrolytic capacitor, integrated with a substrate adapted to carry integrated circuit components, wherein said substrate is coated with at least one sequence of each of the following layers:
   a vacuum deposited film having a high specific surface area, which is selected from the group consisting of valve metals and mixtures of valve metals with valve metal oxides;
   superimposed on said film having a high specific surface area, at least one dielectric film comprising a substance selected from the group consisting of valve metal oxides, their complex oxides with at least one rare earth metal and their complex oxides with at least one alkaline earth metal; and
   a solid electrolyte film superimposed on said at least one film.

2. A method according to claim 1, which comprises at least one of the following features:
   forming said film having a high specific surface area by placing the substrate in an inert atmosphere having a pressure in the range between about $10^{-3}$ torr and about $10^{-2}$ torr, and evaporating at least one valve metal onto said substrate under said inert atmosphere, thereby imparting a surface structure to the substrate;
   forming said at least one dielectric film by a procedure selected from:
   plasma anodic oxidation;
   evaporating at least one valve metal onto said vacuum deposited film having a high specific surface area, in an oxidizing atmosphere,
   evaporating said oxide directly onto said vacuum deposited film having a high specific surface area, and
   thermally oxidizing said vacuum deposited film having a high specific surface area;
   forming an additional metal oxide film by electrolytic anodization between said at least one dielectric film and said solid electrolyte film;
   vacuum deposition of at least one metal film onto said solid electrolyte film.

3. A method according to claim 2, which comprises additionally at least one of the following features:
   independently selecting each of said valve metals from the group consisting of tantalum and aluminum;
   selecting the same metal for each of said valve metals;
   forming said at least one film as a discontinuous layer, on said vacuum deposited film having a high specific surface area;
   utilizing as said substrate one which is adapted to be used as a printed circuit board substrate;
   utilizing as said inert atmosphere one which includes nitrogen;
   utilizing as said inert atmosphere one which is anhydrous;
   introducing oxygen into said inert atmosphere prior to said evaporating of said at least one valve metal;
   heating said substrate to between about 350° C. and about 550° C. during said evaporating of said at least one valve metal;
   vacuum depositing said film having a high specific surface area under such conditions that it forms a cauliflower-like morphology.

4. A method according to claim 1, which comprises at least one of the following features:
   forming said at least one dielectric film by a procedure selected from vacuum deposition and plasma anodic oxidation;
   forming said solid electrolyte film by vacuum deposition;
   carrying out all operations at a temperature below about 250° C.

5. A method according to claim 1, wherein said film having a high specific surface area is vacuum deposited under such conditions that it has a fractal surficial structure which includes both valve metal and an oxide thereof.

6. A method according to claim 5, wherein said valve metal is aluminum.

7. A method according to claim 1, wherein said film having a high specific surface area is vacuum deposited under such conditions that it has a columnar structure.

8. A method according to claim 1, wherein said at least one dielectric film is at least one valve metal oxide film applied by electrolytic anodization, of at least one valve metal present in said vacuum deposited film having a high specific surface area.

9. A method for making an integrated electrolytic capacitor, wherein a substrate is coated with each of the following layers:
   a vacuum deposited film of high specific surface area, which has a fractal surficial structure including both a valve metal and an oxide thereof, provided that where said valve metal is aluminum and said film having a high specific surface area contains no more than about 30.3% of the total aluminum as aluminum oxide;

superimposed on said film having a high specific surface area, at least one film of an oxide applied by electrolytic anodization, of at least one valve metal present in said vacuum deposited film having a high specific surface area; and a solid electrolyte film superimposed on said at least one film.

10. An integrated electrolytic capacitor which comprises at least one sequence of each of the following layers coated on a substrate adapted to carry integrated circuit components:

a non-anodized vacuum deposited film having a high specific surface area, which is selected from the group consisting of valve metals and mixtures of valve metals with valve metal oxides;

superimposed on said film having a high specific surface area, at least one dielectric film comprising a substance selected from the group consisting of valve metal oxides, their complex oxides with at least one rare earth metal and their complex oxides with at least one alkaline earth metal;

an optional additional metal oxide film formed by electrolytic anodization and superimposed on said at least one film; and a solid electrolyte film superimposed on said at last one of the following films (i) and (ii), namely:

(i) said at least one dielectric film;

(ii) said optional additional metal oxide film if present.

11. A capacitor according to claim 10, wherein at least one of the following features is present:

it comprises also a vacuum deposited metal film superimposed on said solid electrolyte film;

said film having a high specific surface area possesses a structure selected from the group consisting of fractal and columnar structures;

said at least one dielectric film is selected from a vacuum deposited film and a plasma anodic oxidized film;

said solid electrolyte film is a vacuum deposited film;

each of said metals, and the metal of said additional metal oxide if present, is independently selected from tantalum and aluminum;

said substrate is adapted to be used as a printed circuit board substrate.

12. A capacitor according to claim 11, wherein each of said metals, and the metal of said additional metal oxide if present, is identical.

13. A capacitor according to claim 12, wherein said metal is aluminum.

14. An integrated electrolytic capacitor, comprising a substrate coated with each of the following layers:

a vacuum deposited film of high specific surface area, which has a fractal surficial structure including both a valve metal and an oxide thereof;

superimposed on said film having a high specific surface area, at least one film of an oxide applied by electrolytic anodization, of at least one valve metal present in said vacuum deposited film having a high specific surface area; and a solid electrolyte film superimposed on said at least one film;

provided that said valve metal is aluminum and said film having a high specific surface area contains no more than about 30.3% of the total aluminum as aluminum oxide.

15. An integrated electrolytic capacitor, which comprises an electrically conductive substrate; a dielectric coating, on the surface of said substrate, having a bimodal morphology, in that the coating includes both a non-electrolytically formed valve metal oxide layer and an electrolytically formed valve metal oxide layer, wherein the non-electrolytically formed layer is homogeneous and the electrolytically formed layer is increasingly porous towards its outer surface; a solid electrolyte film superimposed on said dielectric coating; and an optional vacuum deposited metal film superimposed on said solid electrolyte film;

provided that at least one of the following conditions is fulfilled:

said non-electrolytically formed valve metal oxide layer comprises at least one substance selected from the group consisting of valve metal oxides, their complex oxides with at least one rare earth metal and their complex oxides with at least one alkaline earth metal; or (and)

each valve metal is selected independently from the group consisting of tantalum and aluminum.

16. A capacitor according to claim 10, wherein said substrate is a planar metallic substrate, said solid electrolyte film being connected electrically and mechanically to a metallic member parallel to and substantially coextensive with said substrate, and said capacitor containing if desired injected insulating material in any internal or external voids, if present.

17. A capacitor according to claim 10, wherein said vacuum deposited film having a high specific surface area consists of sequentially deposited first and second sub-films, namely, a first relatively thick film selected from the group consisting of aluminum and mixtures of aluminum with aluminum oxide, and a second relatively thin film selected from the group consisting of valve metals and mixtures of valve metals with valve metal oxides wherein the valve metal is other than aluminum and the valve metal oxides exclude aluminum oxide.

18. A capacitor according to claim 14, wherein said substrate is adapted to be used as a printed circuit board substrate.

19. A capacitor according to claim 15, wherein said substrate is adapted to be used as a printed circuit board substrate.

20. A capacitor according claim 14, wherein said substrate is a planar metallic substrate, said solid electrolyte film being connected electrically and mechanically to a metallic member parallel to and substantially coextensive with said substrate, and said capacitor containing if desired injected insulating material in any internal or external voids, if present.

21. A capacitor according claim 15, wherein said substrate is a planar metallic substrate, said solid electrolyte film being connected electrically and mechanically to a metallic member parallel to and substantially coextensive with said substrate, and said capacitor containing if desired injected insulating material in any internal or external voids, if present.

22. A method according to claim 9, wherein all operations are carried out at a temperature below about 250° C.

* * * * *